(12) United States Patent
Kim et al.

(10) Patent No.: US 10,890,628 B2
(45) Date of Patent: Jan. 12, 2021

(54) DEVICE FOR EVALUATING PERFORMANCE OF SUPERCONDUCTIVE COIL FOR HIGH-TEMPERATURE SUPERCONDUCTIVE ROTARY MACHINE AND METHOD FOR EVALUATING PERFORMANCE OF SUPERCONDUCTIVE COIL THEREBY

(71) Applicant: INDUSTRY-ACADEMIC COOPERATION FOUNDATION JEJU NATIONAL UNIVERSTIY, Jeju-si (KR)

(72) Inventors: Ho-Min Kim, Seoul (KR); Ji-Hyung Kim, Jeju-si (KR)

(73) Assignee: INDUSTRY-ACADEMIC COOPERATION FOUNDATION JEJU NATIONAL UNIVERSITY, Jeju-si (KR)

( * ) Notice: Subject to any disclaimer, the term of this patent is extended or adjusted under 35 U.S.C. 154(b) by 44 days.

(21) Appl. No.: 16/470,416

(22) PCT Filed: Apr. 23, 2018

(86) PCT No.: PCT/KR2018/004663
§ 371 (c)(1),
(2) Date: Jun. 17, 2019

(87) PCT Pub. No.: WO2019/103253
PCT Pub. Date: May 31, 2019

(65) Prior Publication Data
US 2020/0081053 A1    Mar. 12, 2020

(30) Foreign Application Priority Data
Nov. 24, 2017 (KR) .................. 10-2017-0158606

(51) Int. Cl.
*G01R 31/06* (2006.01)
*H02K 55/04* (2006.01)
(Continued)

(52) U.S. Cl.
CPC ............... *G01R 31/72* (2020.01); *G01B 5/30* (2013.01); *G01R 33/072* (2013.01); *H02K 55/04* (2013.01)

(58) Field of Classification Search
CPC .... G01R 31/72; G01R 33/072; G01R 31/343; G01B 5/30; G01B 21/32; H02K 55/04
See application file for complete search history.

(56) References Cited

U.S. PATENT DOCUMENTS

2017/0309384 A1* 10/2017 Fujita ..................... H01F 6/06
2018/0315531 A1* 11/2018 Hamada ............. G01R 33/3815

FOREIGN PATENT DOCUMENTS

| JP | 2004-150809 A | 5/2004 |
| JP | 2007-139577 A | 6/2007 |

(Continued)

*Primary Examiner* — Alvaro E Fortich
*Assistant Examiner* — Zannatul Ferdous
(74) *Attorney, Agent, or Firm* — Novick, Kim & Lee, PLLC; Jae Youn Kim (57) ABSTRACT

The present invention relates to a device for evaluating the performance of a superconductive coil for a high-temperature superconductive rotary machine and a method for evaluating the performance of a superconductive coil thereby. The technical gist of the present invention is to provide schemes for evaluating the stability of a superconductive coil and verifying the reliability thereof, to evaluate/confirm whether or not the same can be commercialized, and to evaluate/confirm the threshold current of a superconductive wire for manufacturing a superconductive coil or the upper limit of the operating current thereof, and is characterized in that the electromagnetic, thermal, and mechanical performances of a superconductive coil for a second-gen- (Continued)

eration high-temperature superconductive rotary machine can be evaluated. The present invention, configured as above, is characterized in that refrigerant supply setup can be freely varied during cooling of a bobbin for cooling a superconductive coil, the magnitude of the electric current through an outer stator can be easily changed according setup control, thereby making it possible to differently adjust the magnitude of a time-variant magnetic field applied to the superconductive coil, and it accordingly becomes possible to set and control an evaluation environment identical to the actual use environment in which the superconductive coil is to be used, thereby securing the reliability of evaluation of performance of the superconductive coil.

8 Claims, 8 Drawing Sheets

(51) Int. Cl.
   *G01R 33/07* (2006.01)
   *G01B 5/30* (2006.01)
   *G01R 31/72* (2020.01)

(56) References Cited

FOREIGN PATENT DOCUMENTS

| | | |
|---|---|---|
| KR | 10-1349362 B1 | 1/2014 |
| KR | 10-1420732 B1 | 7/2014 |
| KR | 10-1428377 B1 | 8/2014 |

* cited by examiner

DEVICE FOR EVALUATING PERFORMANCE OF SUPERCONDUCTIVE COIL FOR HIGH-TEMPERATURE SUPERCONDUCTIVE ROTARY MACHINE AND METHOD FOR EVALUATING PERFORMANCE OF SUPERCONDUCTIVE COIL THEREBY

TECHNICAL FIELD

The present invention relates to an apparatus and a method for evaluating the stability of a superconductive coil, establishing a method of verifying the reliability thereof, determining the possibility of commercialization thereof, and evaluating and confirming a critical current and an upper limit of the operating current of a superconductive wire for manufacturing a superconductive coil, and more particularly to an apparatus for evaluating the performance of a superconductive coil for a high-temperature superconductive rotary machine and a method of evaluating the performance of a superconductive coil using the apparatus, which may accurately evaluate the electromagnetic, thermal and mechanical performance of a superconductive coil for a second-generation high-temperature superconductive rotary machine.

The present invention is configured to enable unrestricted change of a refrigerant supply setting during cooling with respect to a bobbin for cooling a superconductive coil (configured to enable unrestricted change of a refrigerant supply setting when a freezing machine or a refrigerant-circulating module cools a superconductive coil through a bobbin, thereby easily controlling a change in an operating temperature), and is configured to enable unrestricted change of the magnitude of voltage and current of an external stator in accordance with a set control program so as to variably adjust the magnitude of a time-varying magnetic field that is applied to a superconductive coil, thereby providing an evaluation environment that is the same as the actual use environment in which the superconductive coil will be used, and consequently evaluating the performance of the superconductive coil with high reliability.

BACKGROUND ART

In general, superconductive coils are widely used for commercial and research purposes in a medical field such as NMR and MRI and an industrial field such as superconductive rotary machines (motors or generators).

Conventional superconductive coil test apparatuses test the electrical conductivity of a superconductive coil through a method of testing the electrical conductivity using a part of a coil or a small-scale model thereof or through a method of testing the performance of a generator or a motor in which a superconductive coil is mounted.

However, the method of testing the electrical conductivity using a part of a superconductive coil or a small-scale model thereof is not capable of fully simulating a driving environment in which the superconductive coil is used in a motor or a generator.

Further, the method of testing the performance of a motor or a generator in which a superconductive coil is mounted is not capable of obtaining a desired precision of verification result unless a three-dimensional electromagnetic field analysis is applied to the verification through simulation analysis.

In summary, a conventional high-temperature superconductive coil is influenced by a time-varying magnetic field, which is generated by a change in the current flowing through a three-phase armature winding due to the start of operation or a change in a load applied to a rotary machine.

This time-varying magnetic field in the transition state acts as a disturbance that is applied to a second-generation superconductive coil, and causes alternating-current loss and eddy-current loss in a metal support member supporting the superconductive coil, thus causing a rise in the operating temperature of the superconductive coil and resulting in deterioration in the thermal stability and the performance of the superconductive coil.

Further, a three-phase time-varying magnetic field affects the magnetic field distribution of the superconductive coil, and thus deteriorates the critical current characteristics of the high-temperature superconductive coil, thus causing a failure in application of an operating current for generating the rated output of the rotary machine and resulting in deterioration in the output of the rotary machine.

As described above, when a conventional superconductive coil is fabricated and applied to an actual use environment, it is exposed to various thermal, electromagnetic and mechanical problems. However, there is no apparatus capable of accurately evaluating the performance of a superconductive coil in advance.

In recent years, various types of experimental apparatuses for evaluating the performance of a superconductive coil have been devised in the academic world or related industries in order to solve the above problems. However, because the performance evaluation environment created by the experimental apparatuses is different from an actual use environment, the reliability of the evaluation results with respect to the performance of a superconductive coil is so low that it is difficult to use the experimental apparatuses in practice, and thus there still exists a problem in that it is difficult to actually apply a superconductive coil.

RELATED ART DOCUMENT

Patent Document

1. Korean Patent Registration No. 10-1349362 (registered on Jan. 2, 2014)

DISCLOSURE

Technical Problem

Therefore, the present invention has been made in view of the above problems, and it is an object of the present invention to provide an apparatus and a method for evaluating the stability of a superconductive coil, establishing a method of verifying the reliability thereof, determining the possibility of commercialization thereof, and evaluating and confirming a critical current and an upper limit of the operating current of a superconductive wire for manufacturing a superconductive coil, more particularly to provide an apparatus for evaluating the performance of a superconductive coil for a high-temperature superconductive rotary machine and a method of evaluating the performance of a superconductive coil using the apparatus, which may accurately evaluate the electromagnetic, thermal and mechanical performance of a superconductive coil for a second-generation high-temperature superconductive rotary machine.

It is another object of the present invention to provide an apparatus for evaluating the performance of a superconductive coil for a high-temperature superconductive rotary machine and a method of evaluating the performance of a superconductive coil using the apparatus, which may enable unrestricted change of a refrigerant supply setting during cooling with respect to a bobbin for cooling a superconductive coil (enable unrestricted change of a refrigerant supply setting when a freezing machine or a refrigerant-circulating module cools a superconductive coil through a bobbin, thereby easily controlling a change in an operating temperature), and which may enable unrestricted change of the magnitude of voltage and current of an external stator in accordance with a set control program so as to variably adjust the magnitude of a time-varying magnetic field that is applied to a superconductive coil, thereby providing an evaluation environment that is the same as the actual use environment in which the superconductive coil will be used, and consequently evaluating the performance of the superconductive coil with high reliability.

Technical Solution

In accordance with an aspect of the present invention, the above objects can be accomplished by the provision of an apparatus for evaluating the performance of a superconductive coil, wherein superconductive coils 200 are mounted symmetrically on one side and the opposite side of an inner circumferential surface of a rotor 100 configured to rotate about an axis in a circumferential direction, each of the superconductive coils 200 is provided on an outer circumferential surface thereof with a hall sensor 210, a temperature sensor 220, and a strain gauge 230 for measuring structural strain in order to detect a magnetic field and temperature distribution characteristics, a bobbin 300 is disposed on the bottom surface of each of the superconductive coils 200 in order to support and cool the superconductive coils and is formed so as to cool the superconductive coils 200 through a conduction method using a separate freezing machine or a refrigerant circulation module 310, which is provided on an inner side or an outer side of the bobbin 300, the freezing machine or the refrigerant circulation module 310 is formed so as to enable unrestricted change of a refrigerant supply setting when cooling the superconductive coils 200 through the bobbin, thus easily controlling an operating temperature, a stator 500 including a three-phase armature winding 400 is provided on an outer circumferential surface of the rotor 100, the three-phase armature winding 400 is connected to a three-phase alternating-current (AC) power supply 600 supplying current to generate a three-phase time-varying magnetic field, and the three-phase AC power supply 600 is configured to adjust the magnitude of voltage and current of the three-phase armature winding 400 and a frequency applied thereto so as to evaluate the performance of the superconductive coils 200 under a time-varying magnetic field in an environment that is the same as the actual use environment.

The superconductive coils are impregnated with a liquid refrigerant injected into the rotor 100 from the outside, thus causing direct heat exchange between the refrigerant and the superconductive coils 200.

Each of the superconductive coils 200 is provided on an outer circumferential surface thereof with a cooling jacket 240, and the cooling jacket 240 serves to uniformly distribute a solid refrigerant having a large thermal capacity so that the operating temperature is maintained stable even in the event of a thermal disturbance.

When the refrigerant circulation module 310 is applied to the bobbin 300, the refrigerant circulation module 310 is configured such that an injection pipe 311 and a discharge pipe 312, which form a parallel cooling channel, diverge in the form of branch pipes from a transfer pipe 313 so as to form a refrigerant supply line and a refrigerant return line together with the bobbin and to cool the superconductive coils 200, and the injection pipe 311 and the discharge pipe 312 are connected to an external refrigerant-generating device 314 and a cryogenic pump 315 so as to adjust the operating temperature.

In addition, each of the superconductive coils 200 is provided on an outer circumferential surface thereof with a heating member 250 to apply an energy corresponding to an operating temperature margin value to each of the superconductive coils for a predetermined time period, to locally quench each of the superconductive coils, and to test thermal performance.

In accordance with another aspect of the present invention, there is provided a method of evaluating the performance of a superconductive coil for a high-temperature superconductive rotary machine, wherein evaluation of characteristics in accordance with the position of a rotor 100 relative to a stator 500 of a rotary machine is realized while rotating the rotor 100 to which a superconductive coil 200 is mounted, and a damper structure is disposed between the superconductive coil 200 and the stator 500 on which a three-phase armature winding 400 is disposed, thus enabling evaluation of the performance of the superconductive coil in accordance with the presence or absence of the damper structure 800.

The above-described method of evaluating the performance of a superconductive coil is performed such that the performance characteristics of the rotary machine are tested by implementing the superconductive coil 200 as a one-pole field superconductive coil and by measuring a magnetic flux and electromotive force linked in the three-phase armature winding 400 disposed on the stator 500.

In addition, the above-described method of evaluating the performance of a superconductive coil is performed such that power is applied to an armature through a three-phase power slip ring or a separate excitation device so as to mechanically rotate the stator on which the three-phase armature winding is disposed, whereby evaluation of characteristics is realized in the state in which the rotor to which the superconductive coil is mounted is stopped, thus eliminating attached devices for cooling the rotor, simplifying the construction of a characteristics evaluation apparatus, and improving the reliability thereof.

Advantageous Effects

According to the present invention, it is possible to evaluate the performance of a superconductive coil for a rotor field winding with high reliability in consideration of the actual operating environment, including the temperature, current, and magnetic field, which may affect normal operation, and it is possible to maintain the operating temperature of 1.8 to 300 K and the degree of vacuum of $10^{-7}$ Torr or greater.

In addition, according to the present invention, it is possible to apply a cooling method using a gaseous or liquid refrigerant (an impregnation cooling method with respect to the superconductive coil and a bobbin conduction cooling method with respect to the superconductive coil), a conduction cooling method using a cryogenic freezing machine, and a hybrid refrigerant cooling method using both a liquid refrigerant and a solid refrigerant. Further, the stator disposed around the rotor enables evaluation of the thermal and electrical characteristics of the superconductive coil mounted to the rotor in the state in which an external time-varying magnetic field is applied to the superconductive coil.

In addition, according to the present invention, it is possible to evaluate the characteristics of the superconductive coil in accordance with the position of the rotor relative to the stator of the rotary machine while rotating the rotor to which the high-temperature superconductive coil is mounted, to evaluate the performance of the high-temperature superconductive coil in accordance with the presence or absence of the damper structure disposed between the superconductive coil and the stator on which the three-phase armature winding is disposed, to enable change of the operating temperature and the current using an external cooling device and a DC power supply, which are connected to the superconductive coil, and to enable unrestricted change of the magnitude of an external time-varying magnetic field that is generated using the three-phase armature winding.

In addition, the present invention enables repeated cooling operation in the range from room temperature to an operating temperature in the state in which an external time-varying magnetic field is applied, thereby making it possible to perform reliable performance evaluation. Further, the present invention enables repeated thermal performance tests by inserting a heater into the peripheral portion of the superconductive coil in order to determine whether reliable operation is possible even when the operating temperature increases due to a thermal disturbance.

In addition, when a hybrid refrigerant cooling method is applied, the present invention enables simulation of various operating-temperature environments by applying various candidate cryogenic refrigerants that may be used for the hybrid refrigerant cooling method. Further, it is possible to collectively evaluate the electrical, thermal and mechanical characteristics of the high-temperature superconductive field coil through a conduction cooling method using a cryogenic freezing machine. Furthermore, the present invention enables real-time measurement and evaluation of the performance of the high-temperature superconductive field coil using DAQ equipment linked to a magnetic field sensor, a temperature sensor and a strain gauge.

BEST MODE

Hereinafter, the present invention will be described in detail with reference to the accompanying drawings.

As shown in FIGS. 1 to 8, the present invention relates to an evaluation apparatus capable of evaluating the electromagnetic, thermal and mechanical performance of a superconductive coil for a MW-class second-generation high-temperature superconductive rotary machine in order to evaluate the stability of a superconductive coil, establish a method of verifying the reliability thereof, and set critical current and an upper limit of the operating current of a superconductive wire for manufacturing a commercial superconductive coil.

The present invention is configured to include superconductive coils 200, which are mounted symmetrically on one side and the opposite side of the inner circumferential surface of a rotor 100, which rotates about an axis in a circumferential direction.

Each of the superconductive coils is seated on one surface of a respective one of cooling bobbins 300, and is disposed adjacent to a three-phase armature winding of a stator. Each of the bobbins is formed so as to be supported and fixed by a respective one of the support frames 700, each being formed so as to have a triangular-shaped cross-section with respect to a central axis.

Figure 1:
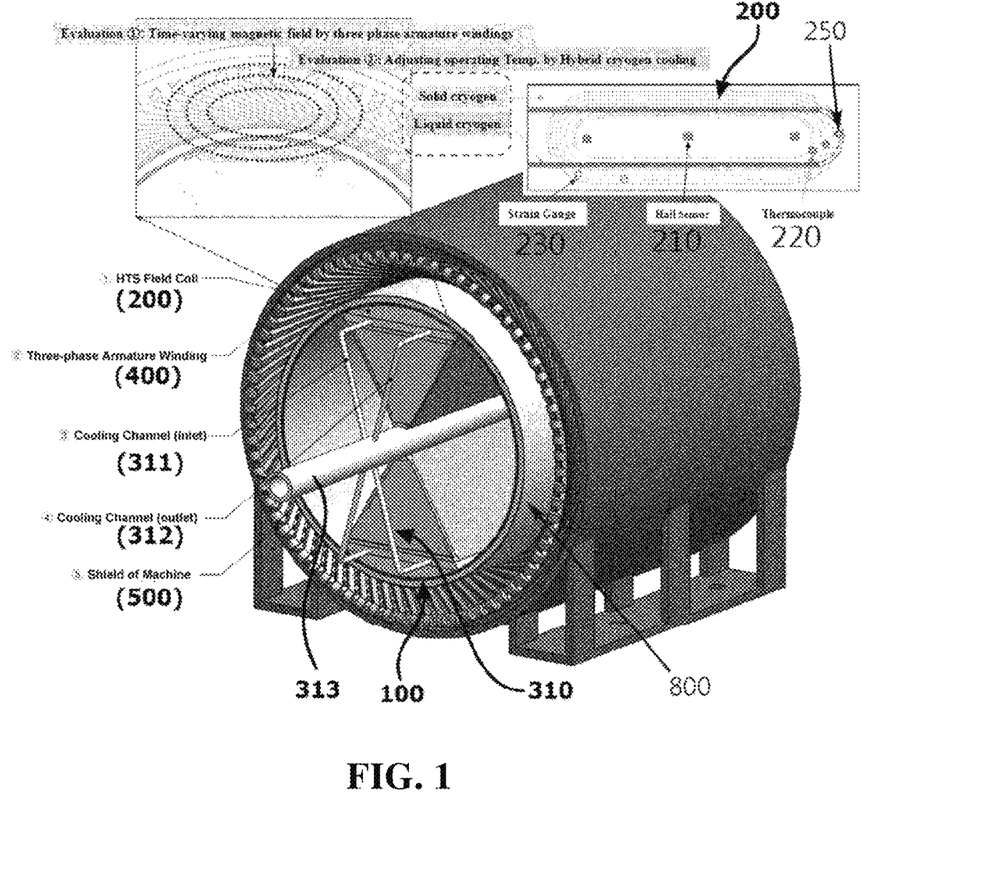
FIG. 1 is a view illustrating an apparatus for evaluating the performance of a superconductive coil according to the present invention.
Figure 2:
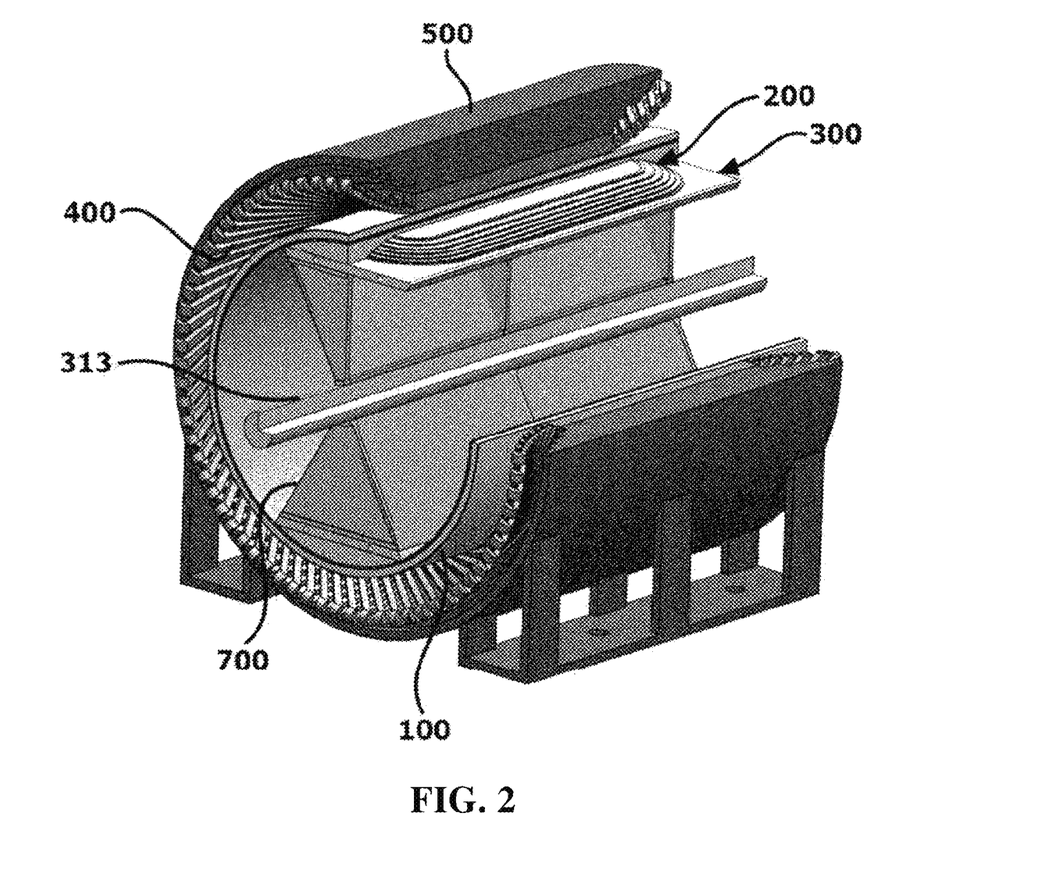
FIGS. 2 and 3 are enlarged partially cut away views illustrating the apparatus shown in FIG. 1.
Figure 3:
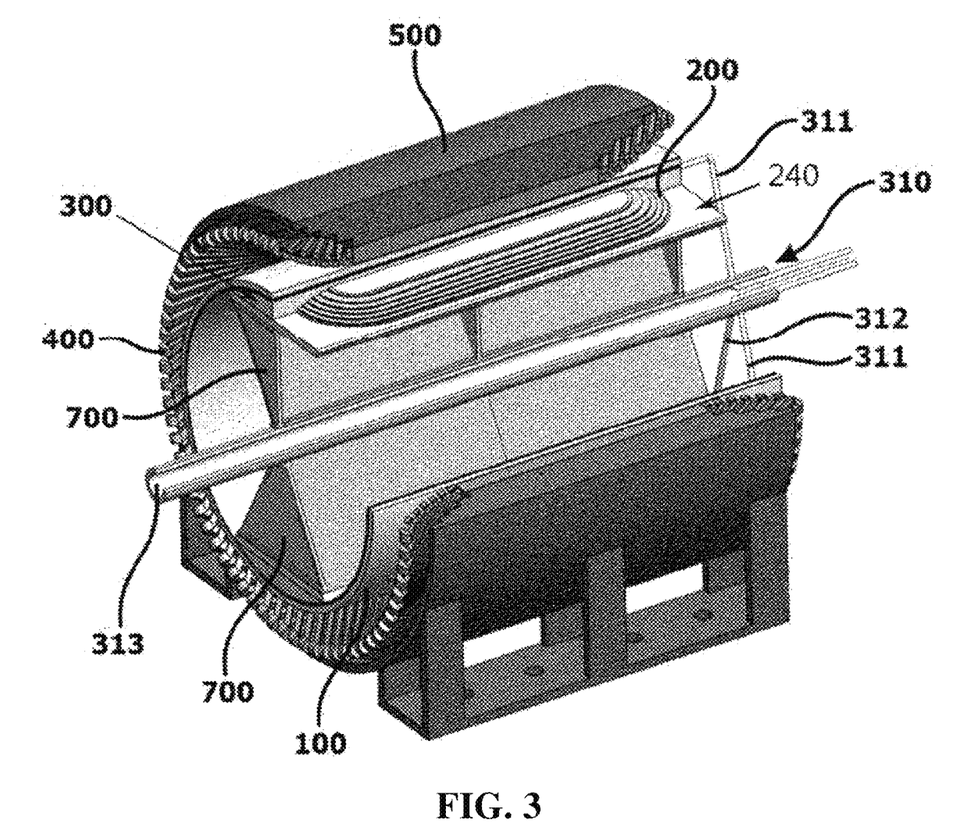
Figure 4:
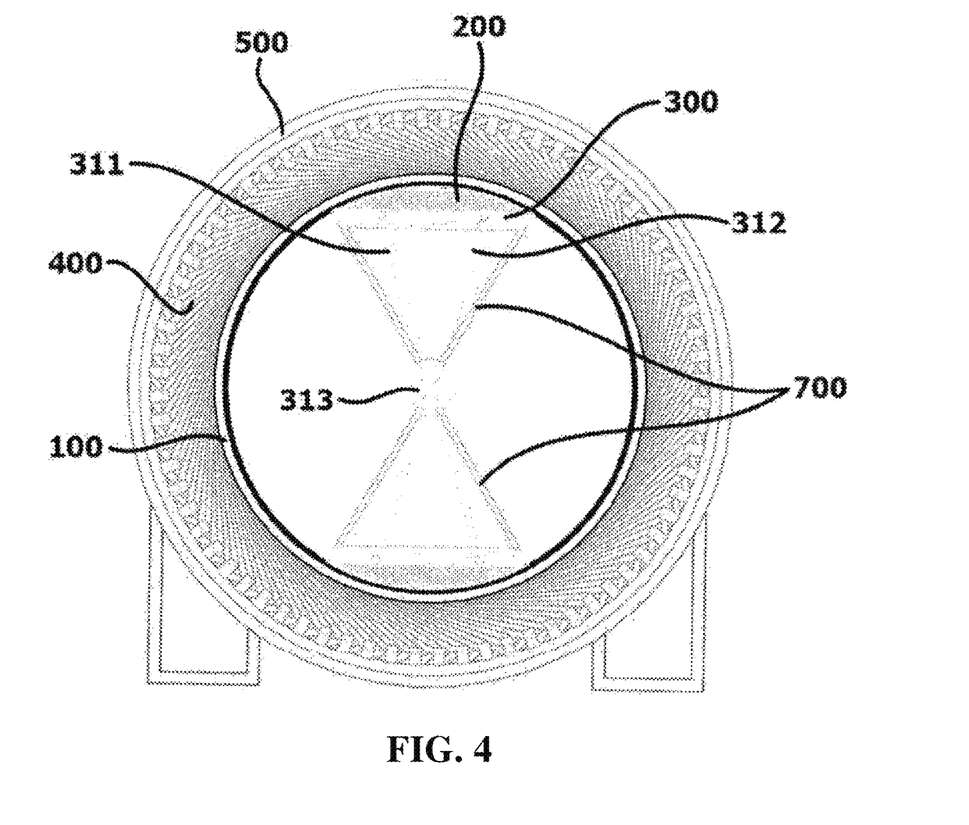
FIG. 4 is a front cross-sectional view of FIG. 1.
Figure 5:
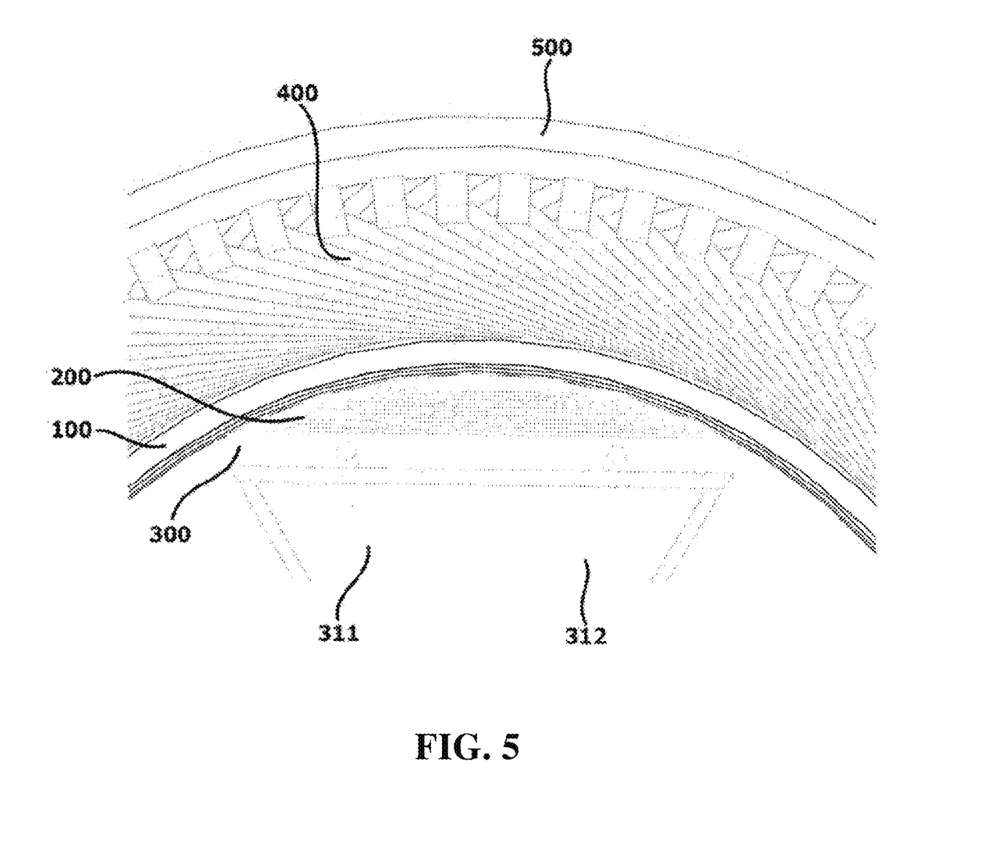
FIG. 5 is an enlarged cross-sectional view of essential parts of FIG. 4.
Figure 6:
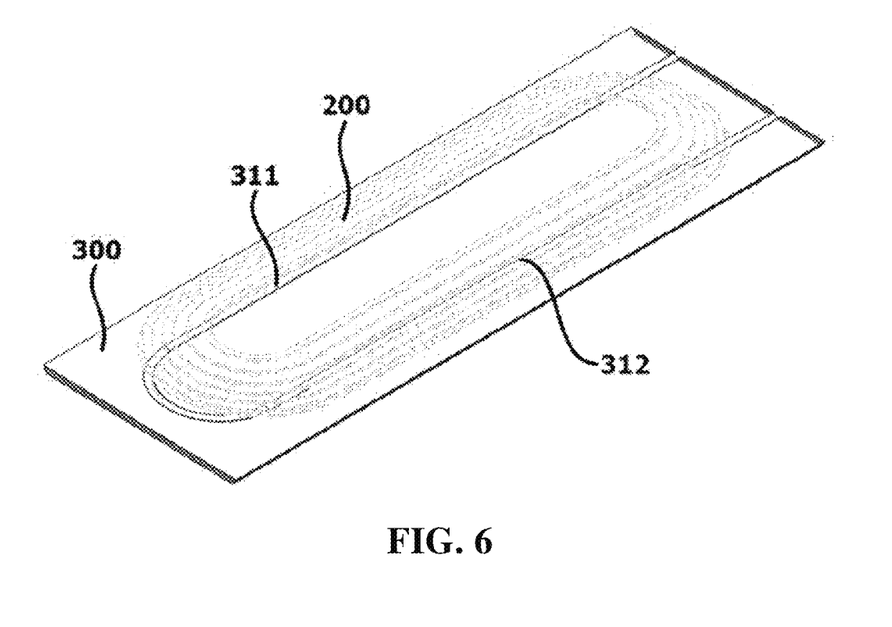
FIG. 6 is a view illustrating the state in which a superconductive coil according to the present invention is coupled to a bobbin.

Each superconductive coil 200 is provided on an outer circumferential surface thereof with a hall sensor 210, a temperature sensor 220, and a strain gauge 230 for measuring structural strain in order to detect a magnetic field and temperature distribution characteristics (refer to FIG. 1).

The hall sensor, the temperature sensor and the strain gauge may vary in position depending on the shape of the designed superconductive coil.

Each of the bobbins 300 is disposed on the bottom surface of a respective one of the superconductive coils 200 in order to support and cool the same.

Here, the bobbin 300 is formed so as to cool the superconductive coil 200 through a conduction method using a separate freezing machine or a refrigerant circulation module 310, which is provided on the inner side or the outer side of the bobbin 300.

The freezing machine or the refrigerant circulation module 310 is formed so as to enable unrestricted change of the refrigerant supply setting when cooling the superconductive coil 200 through the bobbin, thus easily controlling the operating temperature.

Figure 7:
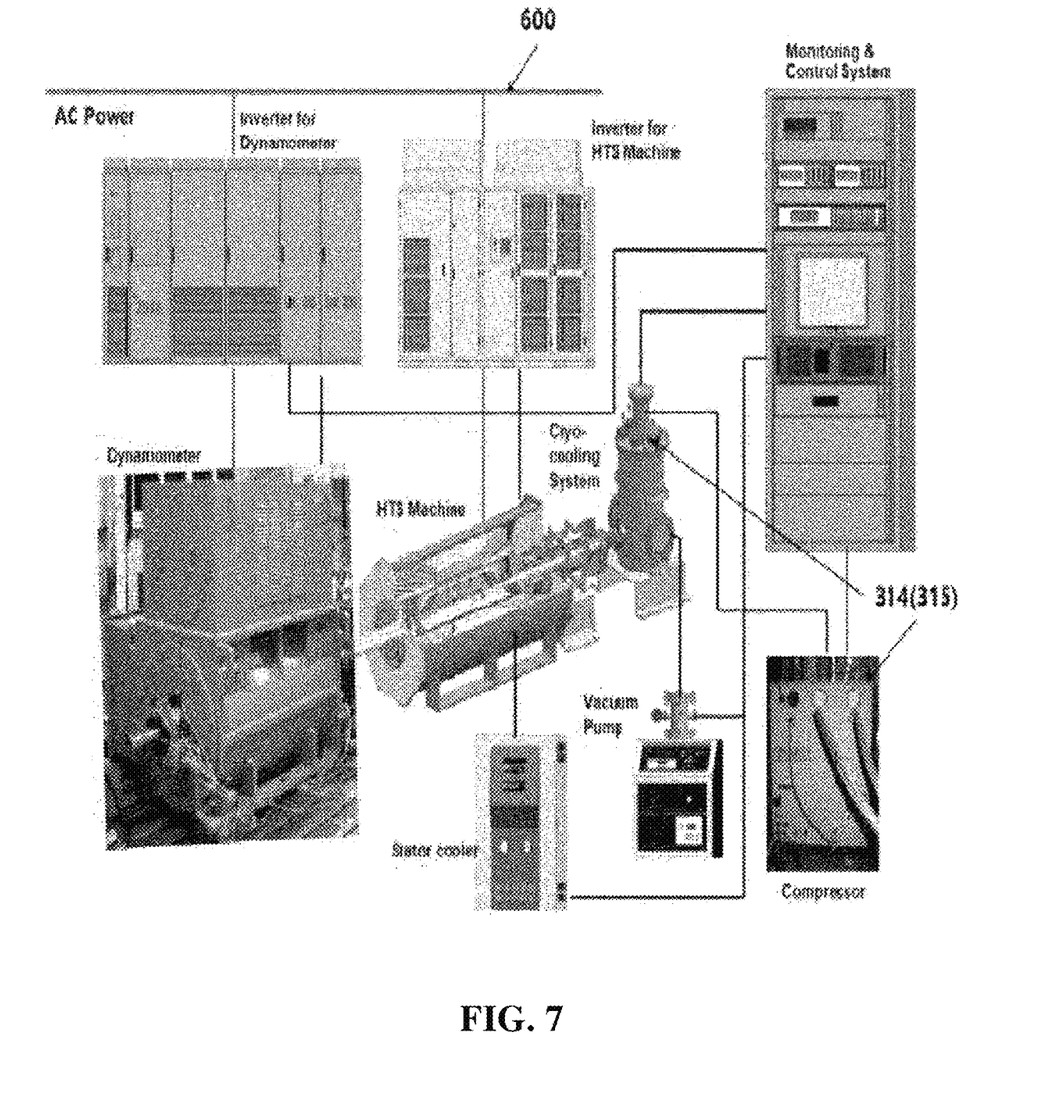
FIGS. 7 and 8 are views schematically illustrating a system in which a superconductive rotary machine is connected to other equipment.
Figure 8:
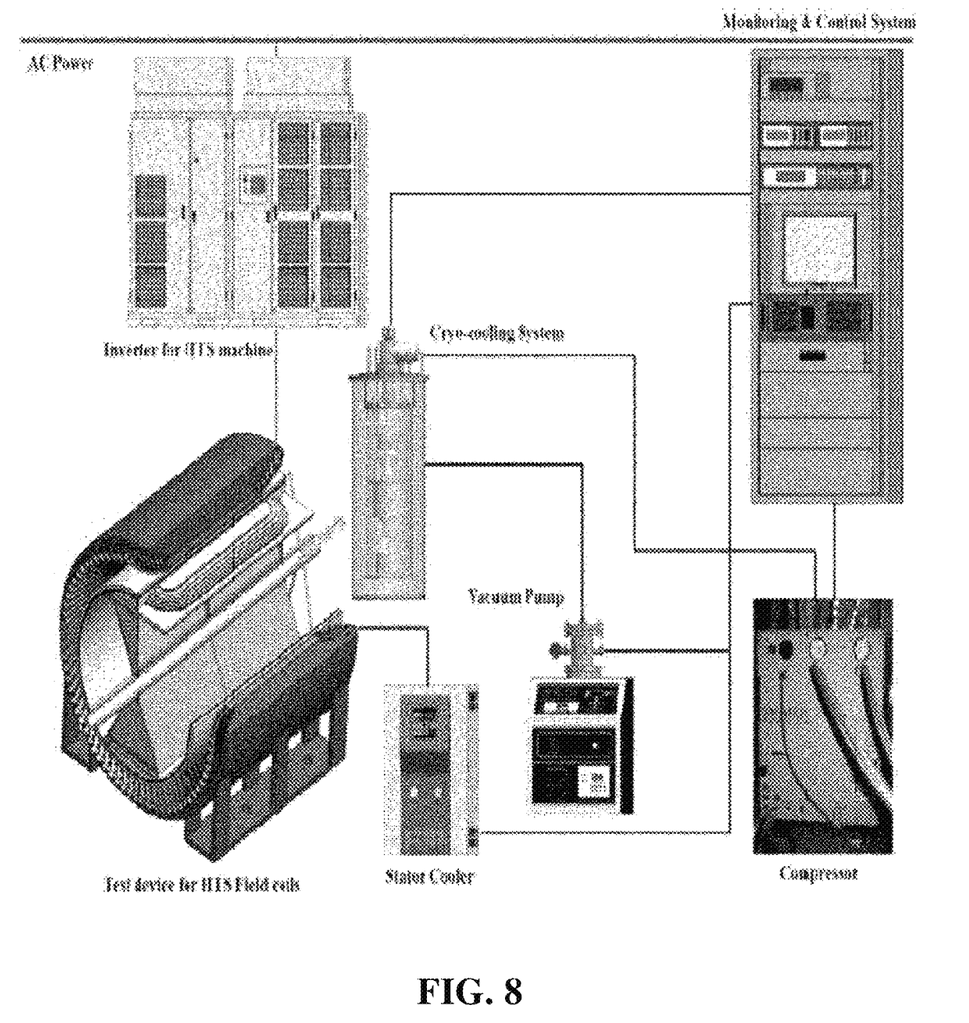

A stator 500 having a three-phase armature winding 400 is provided on an outer circumferential surface of the rotor 100, and the three-phase armature winding 400 is connected to a three-phase alternating-current (AC) power supply 600 for supplying current to generate a three-phase time-varying magnetic field (refer to FIG. 7).

That is, the three-phase AC power supply is a power supply for driving a superconductive motor, and is illustrated as an "Inverter for HTS machine" in FIG. 7. Further, a dynamometer-driving power supply is illustrated as an "Inverter for dynamometer" in FIG. 7.

The three-phase AC power supply 600 is configured to adjust the magnitude of voltage and current of the three-phase armature winding 400 and the frequency applied thereto so as to evaluate the performance of the superconductive coil 200 under the time-varying magnetic field in an environment that is the same as the actual use environment.

The superconductive coil 200 is impregnated with a gaseous or liquid refrigerant injected into the rotor 100 from the outside, thus causing direct heat exchange between the refrigerant and the superconductive coil 200.

A cooling jacket 240 is formed on the outer circumferential surface of the superconductive coil 200, and serves to uniformly distribute a solid refrigerant having a large thermal capacity so that the operating temperature is maintained stable even in the event of a thermal disturbance.

In the case in which the refrigerant circulation module 310 is applied to the bobbin 300, the refrigerant circulation module 310 is configured such that an injection pipe 311 and a discharge pipe 312, which form a parallel cooling channel, diverge in the form of branch pipes from a transfer pipe 313 so as to form a refrigerant supply line and a refrigerant return line together with the bobbin and to cool the superconductive coil 200. The injection pipe 311 and the discharge pipe 312 are connected to an external refrigerant-generating device 314 and a cryogenic pump 315 so as to change the operating temperature and to supply and collect the refrigerant (refer to FIG. 7).

Referring to FIG. 7, the external refrigerant-generating device 314 corresponds to a compressor and a cryo-cooling system, and the cryogenic pump 315 is installed in the cryo-cooling system. The refrigerant, which is in a heated state after having cooled the superconductive motor, is collected into the cryo-cooling system and is cooled again thereby, and the cooled refrigerant is introduced again into the superconductive rotary machine. At this time, the cryogenic pump 315 serves to forcibly circulate the refrigerant.

Further, a heating member 250 is additionally mounted on the outer circumferential surface of the superconductive coil 200 in order to apply an energy corresponding to an operating temperature margin value to the superconductive coil 200 for a predetermined time period to thus locally quench the superconductive coil 200, thereby making it possible to test the thermal performance.

Described in more detail, FIG. 1 is a view illustrating the construction of the apparatus for evaluating the performance of the second-generation superconductive coil. The superconductive coil 100 is formed by winding a second-generation high-temperature superconductive wire in the form of a pancake.

The injection pipe 311 and the discharge pipe 312 of the cooling channel form a forcible refrigerant circulation channel, which performs hybrid refrigerant cooling using an external refrigerant (a gaseous or liquid refrigerant) and a solid refrigerant in the rotor.

That is, the bobbin is cooled by the gaseous or liquid refrigerant flowing through the refrigerant circulation channel, and the superconductive coil is mainly cooled in a conduction manner.

Further, the three-phase armature winding 400 is disposed on the inner circumferential surface of the stator 500 (the shield of the machine) in order to detect the characteristics of the field coil in accordance with an external time-varying magnetic field, and is connected to the three-phase AC power supply for supplying current to generate a three-phase time-varying magnetic field.

Here, the three-phase AC power supply enables adjustment of the applied frequency as well as the magnitude of voltage and current, thus making it possible to evaluate the performance of the high-temperature superconductive coil under the time-varying magnetic field having various magnitudes and frequencies.

In the state in which the superconductive coil is cooled to a temperature below a target operating temperature, the superconductive coil is charged with a target operating current, and a three-phase AC current is applied to the three-phase armature winding in order to generate a rated AC magnetic field and a time-varying magnetic field exceeding a rating.

To this end, the injection pipe and the discharge pipe of the cooling channel are arranged in such a manner as to circulate while passing through the bobbin supporting the superconductive coil, and are connected to the external refrigerant-generating device and the cryogenic pump in order to inject and discharge the refrigerant corresponding to the operating temperature (in the case in which a cryogenic refrigerant is applied).

The stator 500 (the shield of the machine) is formed so as to prevent the time-varying magnetic field of the armature winding from leaking to the outside. In particular, the stator is formed in a structure in which electrical steel sheets are stacked. The reason for this is to reduce the eddy-current loss generated in the shield of the machine.

In addition, a damper structure is disposed between the superconductive coil and the stator on which the three-phase armature winding is disposed such that the performance of the superconductive coil is evaluated in accordance with the presence or absence of the damper structure.

Here, the rotor to which the superconductive coil is mounted is rotated so that the physical angle between the rotor and the stator of the rotary machine is changed, thus making it possible to evaluate the characteristics of the superconductive coil in accordance with the angle at which the external time-varying magnetic field is applied.

In order to determine whether reliable operation is possible even when the operating temperature increases due to a thermal disturbance, a heater is inserted into the peripheral portion of the superconductive coil in order to apply an energy corresponding to an operating temperature margin value (e.g. $\Delta T=5$ or 10 K) to the superconductive coil for a predetermined time period to thus locally quench the superconductive coil, thereby making it possible to test the thermal performance.

In order to evaluate the performance of the superconductive coil at various operating temperatures, the external refrigerant-generating device is formed so as to adjust the operating temperature of the superconductive coil in the range of 1.8 to 300 K (room temperature) by adjusting the temperature of the cryogenic refrigerant in the heat exchanger.

Further, a liquid refrigerant impregnation (cryogen batch) method exhibiting high cooling performance may be applied such that the superconductive coil is impregnated with a gaseous or liquid refrigerant injected into the rotor from the outside so as to cause direct heat exchange between the refrigerant and the superconductive coil.

Furthermore, the cooling jacket corresponding to the shape of the superconductive coil is mounted around the superconductive coil so as to distribute a solid refrigerant having a large thermal capacity, thereby enabling a stable operating temperature to be maintained even in the event of a thermal disturbance, thus leading to improved thermal and electrical stability of the field coil.

Still further, besides the cooling method using a gaseous or liquid refrigerant, a conduction cooling method or a cryogen-free method, enabling heat exchange between the superconductive coil and the cryogenic freezing machine through direct connection therebetween, may also be applied.

Here, the superconductive coil may be provided with a conduction plate for heat exchange, which is formed of a material having high thermal conductivity so as to increase the heat-exchange performance thereof, and the performance of the superconductive coil may be evaluated at various temperatures in accordance with the conduction cooling of the cryogenic freezing machine by changing the temperature (1.8 to 300 K) of the cryogenic freezing machine.

Still further, the present invention is characterized in that the hall sensor, the temperature sensor and the strain gauge for measuring structural strain are attached to respective essential parts of the superconductive coil in order to detect a magnetic field and temperature distribution characteristics, thereby measuring electrical signals from the respective sensors in real time using an external signal measurement system (DAQ equipment) and detecting the characteristics of the superconductive coil.

In addition, the present invention provides a method of evaluating the performance of a superconductive coil for a high-temperature superconductive rotary machine, in which evaluation of characteristics in accordance with the position of the rotor 100 relative to the stator 500 of the rotary machine is realized while rotating the rotor 100 to which the superconductive coil 200 is mounted, and in which a damper structure 800 is disposed between the superconductive coil 200 and the stator 500, on which the three-phase armature winding 400 is disposed, thus enabling evaluation of the performance of the superconductive coil in accordance with the presence or absence of the damper structure 800.

As shown in FIG. 1, the damper structure 800 corresponds to the outermost layer (a gray member formed in a cylindrical can shape) of the rotor. The damper structure is formed so as to be detachably mounted to the apparatus (to be disassembled from or assembled to the apparatus in the longitudinal direction or the axial direction), thus making it possible to evaluate the performance of the above-described superconductive coil in various ways.

Therefore, according to the above-described method of evaluating the performance of a superconductive coil, it is possible to test the performance characteristics of the rotary machine by implementing the superconductive coil 200 as a one-pole field superconductive coil and by measuring a magnetic flux and electromotive force linked in the three-phase armature winding 400 disposed on the stator 500.

Further, according to the above-described method of evaluating the performance of a superconductive coil, power may be applied to the armature through a three-phase power slip ring or a separate excitation device so as to mechanically rotate the stator on which the three-phase armature winding is disposed, whereby evaluation of characteristics is realized in the state in which the rotor to which the superconductive coil is mounted is stopped, thus making it possible to eliminate the attached devices for cooling the rotor, to simplify the construction of the characteristics evaluation apparatus, and to improve the reliability thereof.

Although the present invention has been particularly described with reference to the exemplary embodiments, the present invention is not limited thereto, and it is to be understood by those skilled in the art that various modifications or changes can be made without departing from the technical spirit and scope of the invention as disclosed in the accompanying claims. Therefore, the scope of the present invention should be interpreted by the following claims, which have been set forth so as to include such changes.

[Description of Numerals and Marks]

100 . . . rotor
210 . . . hall sensor
230 . . . strain gauge
250 . . . heating member
310 . . . freezing machine or refrigerant circulation module
311 . . . injection pipe
312 . . . discharge pipe
314 . . . refrigerant-generating device
315 . . . cryogenic pump
400 . . . three-phase armature winding
200 . . . superconductive coil
220 . . . temperature sensor
240 . . . cooling jacket
300 . . . bobbin
313 . . . transfer pipe

[Description of Numerals and Marks]

500 . . . stator
600 . . . three-phase alternating-current power supply
700 . . . support frame

The invention claimed is:

1. An apparatus for evaluating performance of a superconductive coil for a high-temperature superconductive rotary machine, the apparatus comprising superconductive coils mounted symmetrically on one side and an opposite side of an inner circumferential surface of a rotor configured to rotate about an axis in a circumferential direction, each of the superconductive coils being provided on an outer circumferential surface of a bobbin with a hall sensor, a temperature sensor, and a strain gauge for measuring structural strain in order to detect a magnetic field and temperature distribution characteristics, wherein the bobbin is disposed on a bottom surface of each of the superconductive coils in order to support and cool the superconductive coils, and is formed so as to cool the superconductive coils through a conduction method using a separate freezing machine or a refrigerant circulation module, which is provided on an inner side or an outer side of the bobbin, the freezing machine or the refrigerant circulation module being formed so as to enable unrestricted change of a refrigerant supply setting when cooling the superconductive coils through the bobbin, thus easily controlling an operating temperature, and wherein a stator including a three-phase armature winding is provided on an outer circumferential surface of the rotor, the three-phase armature winding being connected to a three-phase alternating-current (AC) power supply supplying current to generate a three-phase time-varying magnetic field, the three-phase AC power supply being configured to adjust a magnitude of voltage and current of the three-phase armature winding and a frequency applied thereto so as to evaluate performance of the superconductive coils under a time-varying magnetic field in an environment that is same as an actual use environment.

2. The apparatus according to claim 1, wherein the superconductive coils are impregnated with a liquid refrigerant injected into the rotor from an outside, thus causing direct heat exchange between the liquid refrigerant and the superconductive coils.

3. The apparatus according to claim 1, wherein each of the superconductive coils is provided on the outer circumferential surface of the bobbin with a cooling jacket, the cooling jacket serving to uniformly distribute a solid refrigerant having a large thermal capacity so that the operating temperature is maintained stable even upon a thermal disturbance and to simulate various coil-operating environments through application of various candidate cryogenic solid and liquid refrigerants.

4. The apparatus according to claim 1, wherein, when the refrigerant circulation module is applied to the bobbin, the refrigerant circulation module is configured such that an injection pipe and a discharge pipe, which form a parallel cooling channel, diverge in a form of branch pipes from a transfer pipe so as to form a refrigerant supply line and a refrigerant return line together with the bobbin and to cool the superconductive coils, the injection pipe and the discharge pipe being connected to an external refrigerant-generating device and a cryogenic pump so as to adjust the operating temperature and to enable a temperature-variable conduction cooling method through direct connection between the bobbin and a cryogenic freezing machine.

5. The apparatus according to claim 1, wherein each of the superconductive coils is provided on the outer circumferential surface of the bobbin with a heating member to apply an energy corresponding to an operating temperature margin value to each of the superconductive coils for a predetermined time period, to locally quench each of the superconductive coils, and to repeatedly test thermal performance, thus enabling evaluation of operation reliability.

6. A method of evaluating performance of a superconductive coil for a high-temperature superconductive rotary machine, consisting of: evaluating characteristics in accordance with a position of a rotor relative to a stator of a rotary machine, which is realized while rotating the rotor to which the superconductive coil is mounted, and wherein a damper structure is disposed between the superconductive coil and the stator, on which a three-phase armature winding is disposed, thus enabling evaluation of performance of the superconductive coil in accordance with presence or absence of the damper structure.

7. The method according to claim 6, wherein performance characteristics of the rotary machine are tested by implementing the superconductive coil as a one-pole field superconductive coil and by measuring a magnetic flux and electromotive force linked in the three-phase armature winding disposed on the stator.

8. The method according to claim 6, wherein power is applied to an armature through a three-phase power slip ring or a separate excitation device so as to mechanically rotate the stator on which the three-phase armature winding is disposed, whereby evaluation of characteristics is realized in a state in which the rotor to which the superconductive coil is mounted is stopped, thus eliminating attached devices for cooling the rotor, simplifying construction of a characteristics evaluation apparatus, and improving reliability thereof.

* * * * *